(12) United States Patent
Cremillieux et al.

(10) Patent No.: US 6,589,506 B2
(45) Date of Patent: Jul. 8, 2003

(54) METHOD FOR MAGNETIC RESONANCE IMAGING OF THE LUNG

(75) Inventors: Yannick Cremillieux, Lyons (FR); Yves Berthezene, Ste Foy les Lyon (FR); Magalie Viallon, Lyons (FR)

(73) Assignees: Bracco International B.V., Amsterdam (NL); Centre National de la Recherce Scientifique, Paris Cedex (FR)

(*) Notice: Subject to any disclaimer, the term of this patent is extended or adjusted under 35 U.S.C. 154(b) by 0 days.

(21) Appl. No.: 09/818,274

(22) Filed: Mar. 28, 2001

(65) Prior Publication Data

US 2001/0031242 A1 Oct. 18, 2001

(30) Foreign Application Priority Data

Mar. 28, 2000 (EP) ............................................. 00106635

(51) Int. Cl.$^7$ ................................................ A61B 5/055
(52) U.S. Cl. ...................... 424/9.3; 424/9.32; 424/9.36; 424/9.363; 424/9.364
(58) Field of Search .................. 424/9.3, 9.32, 424/9.36, 9.361, 9.37, 9.363, 9.364, 9.365; 600/410, 428

(56) References Cited

U.S. PATENT DOCUMENTS 6,315,981 B1 * 11/2001 Unger ...................... 424/9.323
6,346,229 B1 * 2/2002 Driehuys et al. ........... 424/9.36
6,370,415 B1 * 4/2002 Weiler et al. ................ 600/410

OTHER PUBLICATIONS

Y. Cremillieux et al.: "A Combined 1H Perfusion/3He Ventilation NMR Study in Rat Lungs" Magnetic Resonance in Medicine, vol. 41, 1999, pp. 645–648.

X. J. Chen et al.: "Spatially Localized T2* Measurements of Hyperpolarized 3He in the Lung" Proceedings of the International Society for Magnetic Resonance in Medicine, Sixth Scientific Meeting and Exhibition, Sydney, Australia Apr. 1998, vol. 1, p. 450.

Q. Chen et al.: "Ventilation–Perfusion MRI of Pulmonary Embolism" Proceedings of the International Society for Magnetic Resonance in Medicine, Sixth Scientific Meeting and Exhibition, Sydney, Australia, Apr. 1998, vol. 1, p. 453.

* cited by examiner

Primary Examiner—Michael G. Hartley
(74) Attorney, Agent, or Firm—Nixon & Vanderhye P.C.

(57) ABSTRACT

A method for the assessment of pulmonary ventilation and lung perfusion through Magnetic Resonance Imaging (MRI), comprising the steps of:

positioning a human subject in an MRI apparatus, delivering a hyperpolarized noble gas to the subject by inhalation, followed by a breath-hold period, during which a bolus of a contrast agent for MRI is injected intravenously, acquiring, during the breath-hold period, at least one MR image of the lungs prior to the bolus intravenous injection and at least one MR image thereafter.

16 Claims, 3 Drawing Sheets

METHOD FOR MAGNETIC RESONANCE IMAGING OF THE LUNG

TECHNICAL FIELD

The present invention relates to the application of hyperpolarized gases to magnetic resonance imaging (MRI).

In particular, this invention relates to a method for the dynamic regional measurement of lung perfusion and ventilation using magnetic resonance imaging based on the use of hyperpolarized noble gases.

TECHNICAL BACKGROUND

In the techniques of nuclear magnetic resonance (NMR) a magnetic field acts on the nuclei of atoms with fractional spin quantum numbers and polarizes them into alignment within some selected orientations. During measurements, radio-frequency pulses of given resonance energy are applied that flip the nuclear spins and disturb the orientation distribution; then the nuclei return (relax) to the initial state in a time dependent exponential fashion, thus giving signals which are electronically processed into recordable data. When the signals are spatially differentiated and of sufficient level, the data can be organized and displayed as images on a screen. For instance, computing the signals generated by the protons ($^1$H) of the water in contact with organic tissues enables to construct images (MRI) allowing direct visualization of internal organs in living beings. This is therefore a powerful tool in diagnostics, medical treatment and surgery.

There exist proton MRI techniques for tissue perfusion measurements, such as contrast enhanced MRI using very short echo time sequences (Berthezène Y et al., Contrast enhanced MR imaging of the lung: assessment of ventilation and perfusion. Radiology 7992, 183: 667–672; Habutu H. et al. Pulmonary perfusion: qualitative assessment with dynamic contrast-enhanced MRI using ultra-short TE and inversion recovery Turbo FLASH, Magn. Reson. Med. 1996; 36: 503–508) or spin labelling techniques (Mai V M and Berr S S: MR perfusion imaging of pulmonary parenchyma using pulsed arterial spin labelling techniques: FAIRER and FAIR. J. Magn. Reson. Imag. 1999; 9: 483–487) but are unfortunately difficult to perform in the lungs. Lung perfusion MRI is first hampered by a low proton density. Magnetic susceptibility effects due to the numerous air/tissue interfaces also shorten the effective transverse relaxation time $T_2$ (Durney C. et al.—Cutillo, A G, editor; Application of Magnetic Resonance to the study of lung. Armonk: Futura Publishing Company; 1996, p. 141–175).

Recently, it has been proposed to use in the MRI of patients isotopes of some noble gases in hyperpolarized form. Although the signal from these isotopes in the naturally polarized state is very weak (5000 times weaker than from $^1$H), hyperpolarization will effectively raise it about $10^4$ to $10^5$ times. Furthermore, the spin relaxation parameters of the hyperpolarized gases are very strongly influenced by the nature of the environment in which they distribute after administration (i.e. they provide a detailed array of signals of different intensities), which makes them very interesting contrast agents in MR imaging.

Hyperpolarizing noble gases is usually achieved by spin-exchange interactions with optically excited alkali metals in the presence or in the absence of an externally applied magnetic field (see e.g. G. D. Cates et al., Phys. Rev. A 45 (1992), 4631; M. A. Bouchiat et al. Phys. Rev. Lett. 5 (1960), 373; X. Zeng et al., Phys. Rev. A 31 (1985), 260). With such techniques, polarization of 10% or more is possible, the normal relaxations ($T_1$, $T_2$) being so long (from several minutes to days in the case of Xe ice that subsequent manipulations (use for diagnostic purposes) are quite possible. Otherwise, hyperpolarization can be achieved by metastability exchange, for instance by exciting $^3$He to the $2^3S_1$ metastable state which is then optically pumped with 1083 nm circularly polarized laser light to the $2^3P_0$ state. Polarization is then transferred to the ground state by metastability exchange collisions with the ground state atoms (see e.g. L. D. Schaerer, Phys. Lett. 180 (1969), 83; F. Laloe et al., AIP Conf. Proc. #131 (Workshop on Polarized 3He Beams and Targets, 1984).

WO-A-95/27438 discloses use of hyperpolarized gases in diagnostic MRI. For instance, after having been externally hyperpolarized, the gases can be administered to living subjects in gaseous or liquid form, either alone or in combination with inert or active components. Administration can be effected by inhalation or intravenous injection of blood that has previously been extracorporally contacted with the gas. Upon administration, the distribution of the gas within the space of interest in the subject is determined by NMR, and a computed visual representation of said distribution is displayed by usual means. No practical example of administration of a parenteral contrast agent composition or formulation, no identification of the additional components is provided.

In an article by H. Middleton et al., Mag. Res. Med. 33 (1995), 271, there is disclosed introducing polarized $^3$He into the lungs of dead guinea-pigs and thereafter producing an NMR image of said lungs.

P. Bachert et al. Mag. Res. Med. 36 (1996), 192 disclose making MR images of the lungs of human patients after the latter inhaled hyperpolarized $^3$He.

WO-A-99/47940 discloses a method for imaging pulmonary and cardiac vasculature and evaluating blood flow using dissolved polarized $^{129}$Xe. This method is carried out by positioning a patient in a magnetic resonance apparatus and delivering polarized $^{129}$Xe gas to the patient via inhalation such as with a breath-hold delivery procedure, exciting the dissolved gas phase with a large flip angle pulse, and generating a corresponding image.

Compared to the clinical scintigraphy technique used for functional pulmonary ventilation and perfusion assessment, and based on the inhalation of radioactive gas ($^{133}$Xe, $^{81}$Kr), noble gas MRI offers an improved spatial and temporal resolution without ionizing radiation (Alderson P O and Martin E C, Pulmonary embolism: diagnosis with multiple imaging modalities, Radiology 1987; 164:297–312). However, MRI using laser-polarized gas has failed, to date, to assess lung perfusion function in a satisfactory way. For instance, the method according to WO-A-99/47940 is not sufficiently accurate, due to the difficulties to distinguish the signals from the gas dissolved in tissues and the gas dissolved in the blood. Furthermore, one has to deal with low signal intensities from dissolved gas.

SUMMARY OF THE INVENTION

Therefore, the problem underlying the present invention was that of providing a method for simultaneously assessing lung perfusion and ventilation, which could overcome the drawbacks of the prior art methods, both those based on proton MRI techniques and those based on hyperpolarized noble gases.

Such a problem has been solved, according to the invention, by a method for the assessment of pulmonary ventilation and lung perfusion through Magnetic Resonance Imaging (MRI), comprising the steps of:

positioning a human subject in an MRI apparatus, delivering a hyperpolarized noble gas to the subject by inhalation, followed by a breath-hold period, during which a bolus of a contrast agent for MRI is injected intravenously, acquiring, during said breath-hold period, at least one MR image of the lungs prior to said bolus intravenous injection and at least one MR image thereafter.

The MRI image acquired after the bolus intravenous injection is taken during the passage of the contrast agent in the pulmonary vasculature.

The contrast agent for MRI used in the present method preferably contains a compound selected among the group comprising superparamagnetic iron oxide nanoparticles (SPIO), ultrasmall superparamagnetic iron oxide nanoparticles (USPIO), gadolinium complexes and manganese complexes.

The SPIO and USPIO are preferably employed as stabilized suspensions.

Examples of suitable suspensions of SPIO and USPIO are provided by the following products:

SBPA (Bracco Research Geneva—Pochon S. et al., Circulating superparamagnetic particles with high T2 relaxivity, Acta Radiologica 1997; 38 (suppl. 412): 69–72): $Fe_3O_4$ particles coated with dipalmitoylglycerophosphatidic acid and a block ethyleneoxidepropyleneoxide copolymer (Synperonic F108 from ICI), ENDOREM® (AMI 25) and SINEREM® (AMI 227) (Guerbet): $Fe_3O_4$ particles coated with dextran; AMI 21: $Fe_3O_4$ particles coated with siloxane; (Jung C W et al. Physical and chemical properties of superparamagnetic iron oxide MR contrast agents: Ferumoxides, ferumoxtran, ferumoxsil; Magnetic Resonance Imaging 13: 661–674 (1995)), RESOVIST® or SHU 555A (from Schering—Hamm B et al., A new superparamagnetic iron oxide contrast agent for magnetic resonance imaging; Investigative Radiology 29; S87–S89 (1994)): $Fe_3O_4$ particles coated with carboxydextran, NC100150 (from Nycomed—Kellar Ke et al. NC100150, a preparation of iron oxide nanoparticles ideal for positive-contrast MR angiography, Magnetic Resonance Materials in Physics, Biology and Medecine 8: 207–213 (1999)): $Fe_3O_4$ particles coated with starch.

The injected dose of the contrast agent containing SPIO or USPIO is preferably in the range of about 0.05 to about 5 mg iron/kg of body weight. Most preferably, such a dose is comprised in the range of about 0.1 to about 1 mg iron/kg.

Examples of suitable Gadolinium complexes are the following:

Gd-DTPA (Magnevist® from Schering), Gd-DOTA (Dotarem® from Guerbet), Gd-HPDO3A (ProHance® from Bracco), Gd-BOPTA (MultiHance® from Bracco), Gd-DTPA-BMA (Omniscan® from Nycomed), GADOVERSETAMIDE (complex of gadolinium with DTPA-bis(methoxyethylamide) from Mallinckrodt), Gadomer-17 (dendrimer from Schering—Qian Dong et al., Magnetic Resonance Angiography with Gadomer-17; Investigative Radiology: 33, 9, 699–708 (1998)), Gd-EOB-DTPA (Gd-ethoxybenzyl-DTPA—Eovist® from Schering); Gadobutrol (Gadovist® from Schering), MS 325 (Complex of gadolinium with (2-(R)-(4, 4-diphenylcyclohexyl) phosphonooxymethyldietilentriaminpenaacetic acid trisodium salt—ANGIOMARK® from Mallinckrodt—Lauffer R B et al.; MS 325: a small-molecule vascular imaging agent for magnetic resonance imaging; Academic Radiology 3: S356–S358 (1996)).

These complexes are administered intravenously in a dose of 0.05 to 0.5 mmol Gd/kg.

As an example of Manganese complexes, it is cited TESLASCAN® or MANGAFODIPIR, a Manganese complex Mn-DPDP from Nycomed (Lim K O et al., Hepatobiliary MR imaging first human experience with Mn-DPDP; Radiology 178: 79–82 (1991)

The hyperpolarized noble gas is selected from the group comprising $^3$He, $^{129}$Xe, $^{131}$Xe, $^{83}$Kr and $^{21}$Ne, and mixtures thereof. $^3$He is particularly preferred.

It is also possible to use mixtures of the hyperpolarized noble gas with nitrogen, air and other physiologically acceptable gases.

The hyperpolarized noble gas is delivered to the human subject in an amount of about 0.1 liter to about 2 liters, then the subject should hold the breath, preferably for at least 10 seconds.

The preferred amount for $^3$He is about 0.1 to about 1 liter

The method according to the present invention proposes for the first time the combined use of a contrast agent, so far used only in proton MRI techniques, and a hyperpolarized noble gas. Through this combination surprisingly good results have been obtained in the assessment of the pulmonary ventilation and, above all, of the lung perfusion. This is of outermost importance for the diagnosis of defects and alterations at the pulmonary blood vessels.

The principle on which the present method is based is at the same time quite simple and very inventive. It will become clear from the subsequent detailed description of the invention, but it is worthwhile giving at least a very rough idea thereof.

Once a subject has inhaled the hyperpolarized noble gas, the NMR apparatus detects a certain signal, whose intensity, as known, progressively decreases. If a bolus of one of the above-mentioned contrast agents is injected right after inhalation of the hyperpolarized gas, the first pass of the contrast agent in the pulmonary vasculature brings about a marked increase of the magnetic susceptibility difference between the alveoli spaces and tissue.

In NMR, static field inhomogeneities generated by these magnetic susceptibility differences induce increased dephasing effects of the transverse nuclear magnetization which in turn results in a reduced NMR signal intensity.

It has been hereby demonstrated that this effect leads to a strong signal depletion during the bolus pass that can in turn be used to estimate the regional pulmonary blood volume.

The above-mentioned signal depletion does not occur if the pulmonary vessels are not totally perfused, because in the presence of any obstruction in a vessel, there is no bolus pass.

Therefore, from the local variations of the profile of the signal intensity it is possible to conclude whether any alterations are present or not.

The characteristics and the advantages of the present invention will become more apparent from the following description of certain preferred but not limiting embodiments thereof, made with reference to the appended drawings.

BRIEF DESCRIPTION OF THE DRAWINGS

FIG. 1a is a reference curve, FIG. 1b represents the $^3$He signal variations during the injection of a bolus of contrast agent; FIG. 1c is the same curve as FIG. 1b after correction of RF pulse effects.

DETAILED DESCRIPTION OF THE INVENTION

Figure 1A:
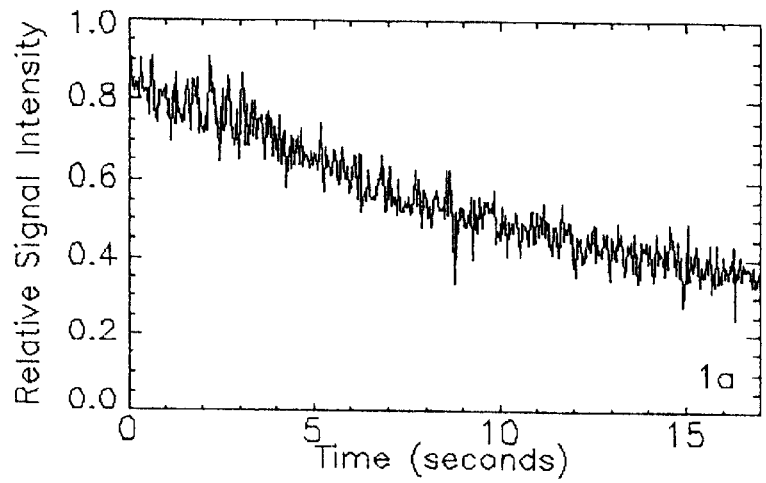
FIGS. 1a to 1c are diagrams of the relative $^3$He NMR signal intensity versus time; in particular

The invention will be now further illustrated with reference to a number of experiments carried out on laboratory animals.

Materials and Methods

The $^3$He gas was polarized via direct optical pumping and metastable spin exchange as described in Colegrove F D et al. Polarization of $^3$He gas by optical pumping, Phys. Rev. 1963; 132: 2561–2572, and in Becker J et al. Study of mechanical compression of spin-polarized $^3$He gas, Nucl. Instrum. Methods 1994; A346: 45–51. A quantity of 370 cm$^3$ laser-polarized gas was achieved in approximately 2 hours with a polarization greater than 50%.

Contrast Agent

The contrast agent used in these experiments was a suspension of superparamagnetic iron oxide nanoparticles (Pochon S. et al., circulating superparamagnetic particles with high T2 relaxivity, Acta Radiologica 1997; 38 (suppl. 412): 69–72) (SBPA, Bracco Research, Geneva).

These nanoparticles are 90±36 nm diameter clusters of 5 nm iron oxide crystals. $R_1$ and $R_2$ relaxivities are respectively 10.5 mM$^{-1}$.s$^{-1}$ and 434 mM$^{-1}$.s$^{-1}$, providing a $R_2/R_1$ ratio approximately equal to ~40. The injectable solution contains 3 mg Fe/ml (54 μmole Fe/ml) and its magnetic susceptibility $\chi$ is equal to 42365.10$^{-6}$ cgs unit/g Fe. The paramagnetic nanoparticles remain in the blood stream with a half-life equal to 2 hours before being cleared by the kidneys.

Animal Preparation

For the experiments, male Sprague-Dawley rats (200–300 g) were used. The animals were anesthetized (intraperitoneal sodium pentobarbital injection) and a catheter was inserted in the trachea to establish further connection with a syringe containing five milliliters of $^3$He and used to deliver the polarized Helium3 for the ventilation experiments. The animal lungs were then maintained filled with the polarized gas for an held breath period during which the MRI data were acquired. An intravenous catheter was also introduced in a rat vein tail and the rat was then positioned in the magnet isocenter.

Magnetic Resonance Imaging

The NMR studies were performed using a small-bore 2 Tesla magnet. Following the $^3$He inhalation, a series of 40 transverse slice-selective $^3$He images were acquired to show the spatial and temporal pulmonary gas distribution. Slice selection was done using a 500 μs 3 lobes sinc pulse. Spin refocusing imposed a minimum echo-time of 1.76 ms. The position of the 20 mm slice was defined using transverse scout images and was located to contain the animal heart.

Each image of the series was obtained in 240 milliseconds using an interleaved spiral-type MRI sequence (Ahn C B et al. High speed spiral scan echo planar NMR imaging, IEEE 1986; MI-5, 1: 2–7; Meyer C H et al. Fast Coronary artery imaging, Magn. Reson. Med. 1992, 28: 202–213; Ruppert K. Et al. Real time MR imaging of pulmonary gas-flow dynamics with hyperpolarized He3, Proceedings of the 6$^{th}$ Scientific Meeting of ISMRM, Sydney, 1998, p. 1909).

A number of 12 interleaved spiral trajectories were used to sample the k-space. The number of revolutions per spiral $N_{rev}$ was equal to 4. The gradients ramping time of our system being 500 μs, the minimum duration of the acquisition was set to 8 ms in order to respect the gradient slew rate. For a number $N_s$=1024 samples per spiral, and an acquisition bandwidth of 100 kHz, the acquisition time of the signal along each spiral trajectories was 10.24 ms.

A inter-image delay of 260 ms was added so that consecutive images were separated by a 500-millisecond time delay, resulting then in a total acquisition time of 20 seconds for the whole series of images. The flip angle was kept constant during the entire dataset acquisition. Shimming was performed on the proton signal on the slice of interest (i.e. 20 mm) to limit off-resonance effects on the Helium3 signal. The FOV was set to 104 mm for the Helium3 experiment.

Results

FIG. 1a shows the evolution of the total $^3$He NMR signal intensity in the animal lungs acquired after each of the radiofrequency excitations. The signal variations curve is obtained by plotting the magnitude of the signal at the center of k-space during the held breath period. The NMR signal intensity variations are due to a combination of several mechanisms, including the polarized nuclear spins flowing in or outside the excited slice of interest, the decay of magnetization due to $^3$He spin-lattice relaxation, and the decrease of polarization due to previous radiofrequency excitation (Johnson G A et al., Dynamics of magnetization in hyperpolarized gas MRI of the lungs, Magn. Reson. Med. 1997; 38, 66–71; Möller H E et al., Signal dynamics in magnetic resonance imaging of the lung with hyperpolarized gases, J. Magn. Reson. 1998; 135, 133–143).

Figure 1B:
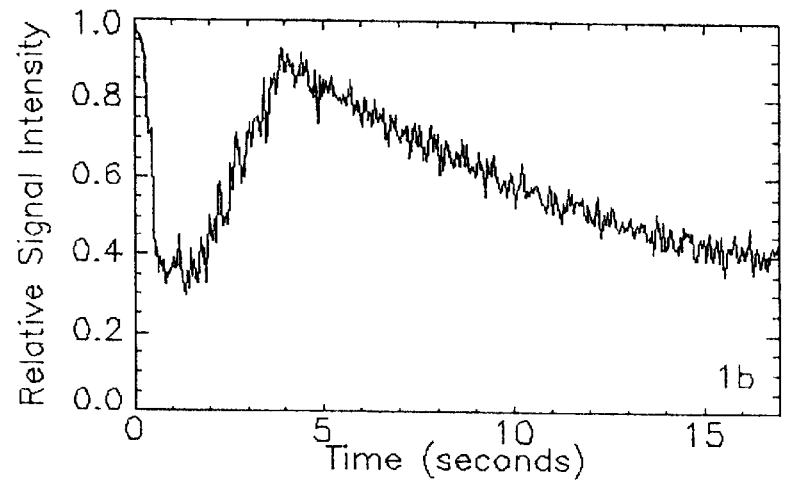

The same dynamic $^3$He ventilation acquisition was performed in combination with the injection of a 1 ml bolus of a diluted contrast agent (suspension of superparamagnetic iron oxide nanoparticles (Pochon et al., as cited above)) in the rat vein tail. FIG. 1b shows the corresponding global $^3$He NMR signal variations.

It can be noticed the large $^3$He signal depletion (60% signal decrease) corresponding to the contrast agent bolus pass in the pulmonary capillary bed. This large signal decrease presumably can be attributed to the magnetic susceptibility difference between the alveoli and the iron oxide nanoparticles flowing through the surrounding capillaries.

It is known that the susceptibility difference between two media can generate static magnetic field distortion in the vicinity of the media interfaces (Ogawa S. et al. Oxygenation-sensitive contrast in Magnetic Resonance Image of rodent brain at high magnetic fields, Magn. Reson. Med. 1990, 14, 68–78). This effect is also exploited in proton MRI for the assessment of blood volume or blood flow in tissues (see e.g. Rosen B R et al., Perfusion imaging with NMR contrast agent. Magn Reson med 1990; 14,:249–265; Axel L. Methods Using Blood Pool Tracers. In: Le Bihan D, editor. Diffusion and Perfusion Magnetic Resonance Imaging. New-York: Raven Press;1995. p 205–211; Caramia F et al. In: Le Bihan D , editor. Diffusion and Perfusion Magnetic Resonance Imaging. New-York: Raven Press; 1995. p 255–267; Ostergaard L et al., High resolution measurement of rCBF using intravascular tracer bolus passages. Part 1: Mathematical approach and statistical analysis. Magn Reson med 1996; 36:715–725; Villringer A et al., Dynamic imaging with lanthanide chelates in normal brain: contrast due to magnetic susceptibility effects. J Magn Reson 1988; 78, 41–55; Majumbar S and Gore J C. Studies of diffusion in random fields produced by variations in susceptibility. J Magn Reson 1988; 78, 41–55).

Static magnetic field inhomogeneities cause dephasing effects of the transverse nuclear magnetization, which in turn result in a reduced NMR signal intensity. This analysis of the $^3$He NMR signal decrease is supported by the shape of the dynamic NMR signal variations.

In order to evaluate the potential of the contrast agent for regional assessment of lung perfusion, the same protocol was applied to an experimental model of pulmonary embolism.

In this model, the rat was placed in a decubitus position and prior to the contrast agent injection, 0.2 ml of air was injected in the vein tail. The air bubble reached and obstructed the pulmonary artery of the lung in the upper position, inducing a local perfusion defect (Berthezène Y. et al., Contrast-enhanced MR imaging of the lung; Assessment of ventilation and perfusion, Radiology 7992; 183: 667–672).

Figure 2:
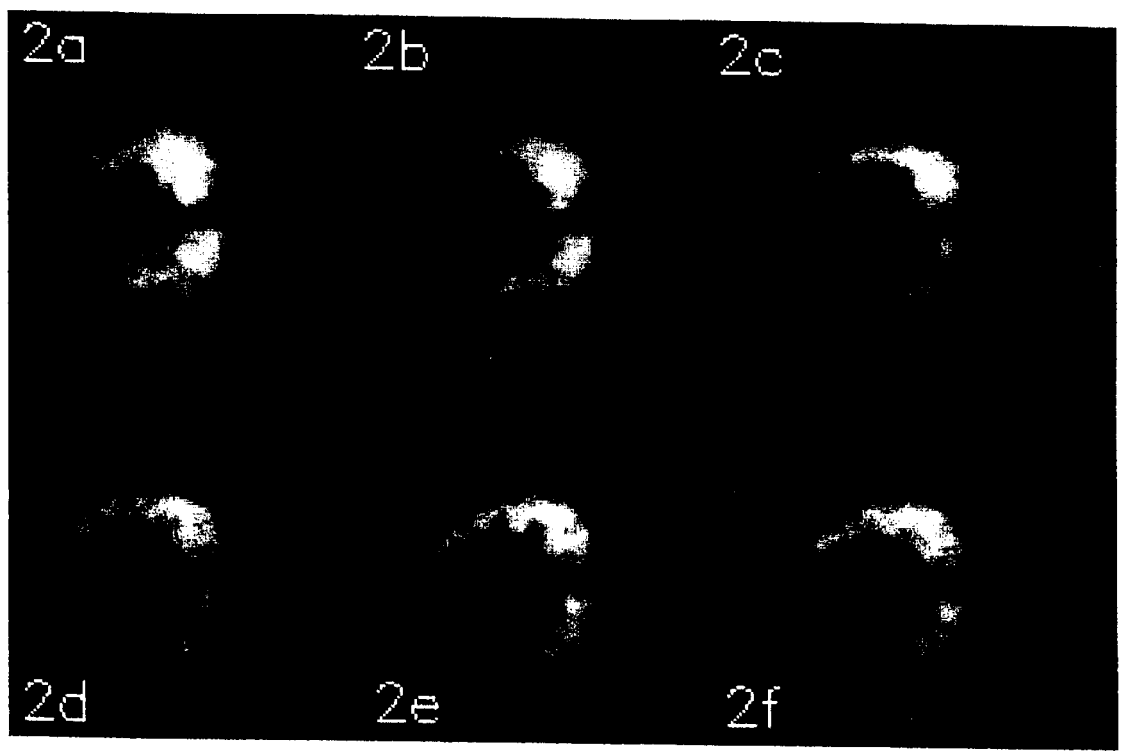
FIG. 2 is an example of dynamic MR images of both lungs of a rat extracted from a series of 40 images obtained with a spiral type MRI sequence.

FIG. 2 shows the time-course $^3$He ventilation images including the gas arrival in the lungs and the contrast agent pass in the lung blood vessels. Such images were obtained with a spiral type MRI sequence.

Image 2a is a pre-contrast image whereas images 2b to 2f correspond to the bolus pass. It can be remarked the signal decay in the lower lung in FIG. 2, reflecting the contrast agent effects on the $^3$He transverse magnetization. This means that the contrast agent has reached the whole lung vasculature.

In contrast, the upper lung shows practically no signal variations due to the embolism perfusion defects. In this case the contrast agent has not been allowed to reach the whole lung vasculature.

The NMR signal variations were analyzed using an approach similar to that in the standard blood volume and blood flow measurements based on dynamic proton signal variations during the first pass of a contrast agent (Rosen B R et al.; Axel L. et al.; Caramia F. et al.; Ostergaard L. et al., as cited above).

According to Stewart-Hamilton model, regional blood volume rBV, can be estimated by integrating the contrast agent tissues concentration C(t) (Lassen N A and Perl W, Tracer kinetic methods in medical physiology, New York; Raven Press; 1984).

Using dynamic MRI, the method is based on the assumption that the variations of the apparent transverse relaxation rate $\Delta R^*_2(t)$ are proportional to the contrast agent concentration C(t). Briefly, the variation of the transverse relaxation rate $\Delta R^*_2(t)$ during the contrast bolus can be determined from the logarithm of the NMR signal intensity S(t). The relative blood volume (rBV) can then be estimated by integration using the following equation:

$$rBV = \int_0^\infty \Delta R^*_2(t) \cdot dt \qquad \text{Eq}[1]$$

Prior to the determination of the relaxation rate variation $\Delta R^*_2(t)$, the $^3$He signal must be corrected from the signal variations (spin-lattice relaxation, gas inflow or outflow, and radiofrequency excitation (Johnson G A et al. and Möller HE et al., as cited above)) unrelated to the contrast agent effects.

In the present experiments, the first two mechanisms were neglected, considering the long spin-lattice relaxation value ($T_1$~15–45 seconds compared to the 4-second bolus pass) measured in the lungs and the fact that the $^3$He signal was acquired during a breathhold period using a large imaging slice (20 mm).

Radiofrequency excitation effects were corrected from the equation: $S(t_2)=S(t_1)\cdot\cos(\alpha)$, where $t_1$ and $t_2$ correspond to two consecutive signal acquisitions and $\alpha$ represents the flip angle of the radiofrequency excitation.

Figure 1C:
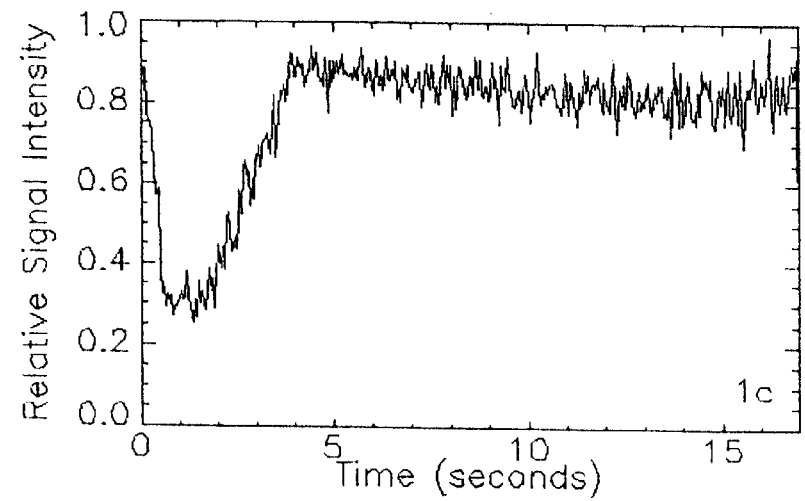

The corrected time-course $^3$He signal is shown in FIG. 1c and illustrates the good signal baseline correction. About 15 seconds after the bolus arrival, the curve exhibits a slight and wide trough, which may be due to the diluted contrast agent recirculation and spread.

A relative pulmonary blood volume map was generated on a pixel-by-pixel basis from the corrected $^3$He ventilation images. In order to eliminate any contribution from recirculation, a gamma-variate function was used to fit the data, prior to analytical integration (Ostergaard L. et al., as cited above).

Figure 3:
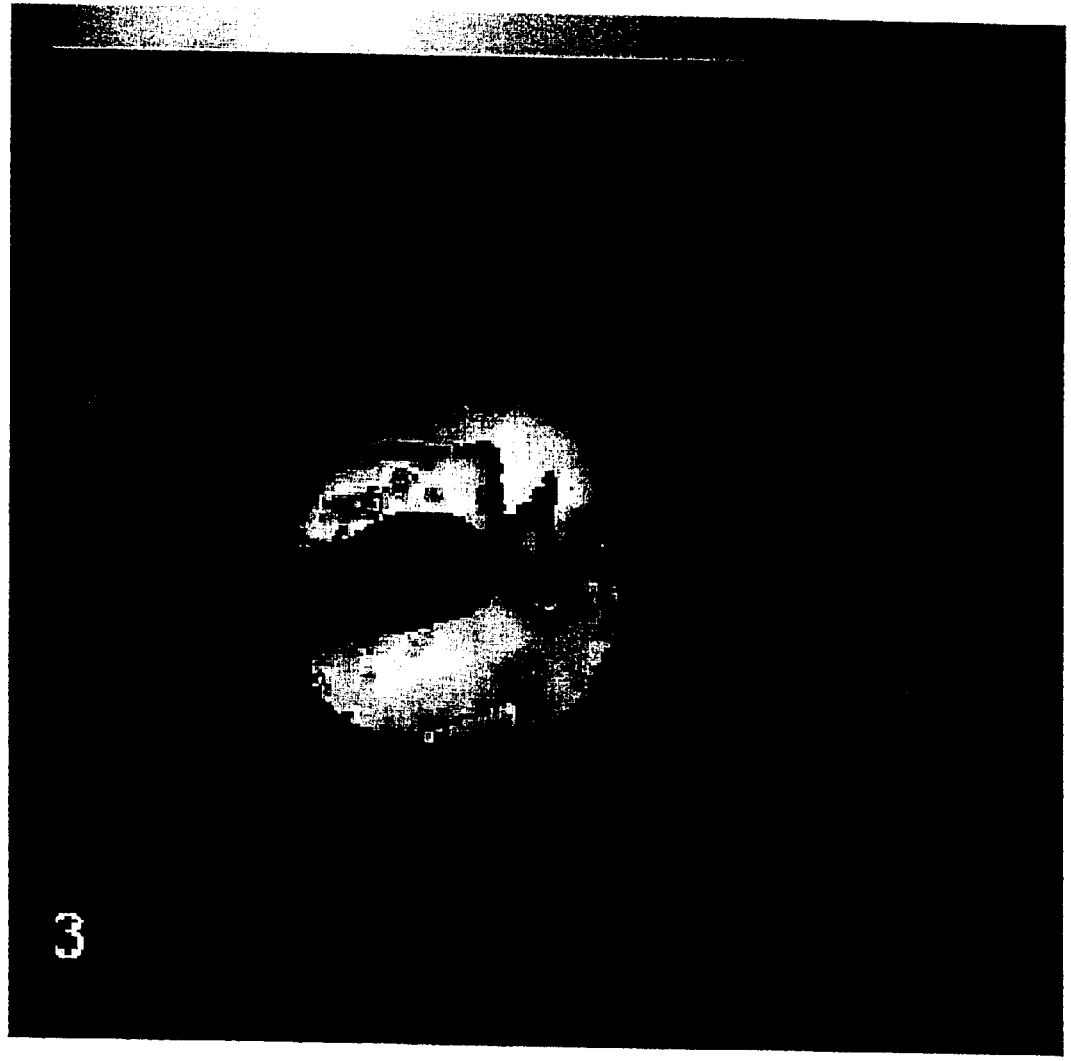
FIG. 3 represents the relative pulmonary blood volume (rBV) map.

FIG. 3 shows the relative pulmonary blood volume map. The rBV map appears quite homogenous in the lower lung and shows a good spatial correlation with the ventilation image. Conversely, the rBV map exhibits a large defect in the upper lung that can be attributed to the perfusion defect induced by the air bubble injection.

From the above-reported experimental results it appears that the method of the present invention represents the first MRI application based on the local magnetic interactions between the pulmonary vasculature medium and the nuclear spins of the gas in the alveoli, allowing simultaneous high resolution lung ventilation/perfusion imaging.

This method opens up a wide range of new applications in the field of lung MRI. Indeed, it represents a powerful way to circumvent the low MRI sensitivity in lungs and to access pulmonary parenchyma perfusion. These potentials are illustrated by the rBV map discussed above, which constitutes a fundamental step towards quantitative pulmonary regional blood volume measurements using MRI.

The method according to the present invention will certainly represent an important tool in the future for the investigation of lung physiology and for contributing to the clinical diagnosis of lung pathologies.

What is claimed is:

1. A method for using a contrast agent for the assessment of the pulmonary ventilation and lung perfusion through MRI, wherein the contrast agent comprises a compound selected from the group consisting of superparamagnetic iron oxide nanoparticles (SPIO), ultrasmall superparamagnetic iron oxide nanoparticles (USPIO), gadolinium complexes and manganese complexes, and the method comprises:

(a) positioning a human subject in an MRI apparatus;

(b) delivering a hyperpolarized noble gas to the subject by inhalation, followed by a breath-hold period, during which a bolus of said contrast agent is injected intravenously; and (c) acquiring, during said breath-hold period, at least one MR image of the lungs prior to said bolus intravenous injection and at least one MR image thereafter.

2. The method according to claim 1, wherein said contrast agent comprises a suspension of SPIO or USPIO selected from the group consisting of SBPA, AMI 25, AMI 227, SHU 555A and NC100150.

3. The method according to claim 1, wherein said contrast agent comprises a gadolinium complex selected from the group consisting of Gd-DTPA, Gd-DOTA, Gd-HPDO3A, Gd-BOPTA, Gd-DTPA-BMA, Gadoversetamide, Gadomer-17, Gd-EOB-DTPA, Gadobutrol and MS 325.

4. The method according to claim 1, wherein said hyperpolarized noble gas is selected from the group consisting of $^{3}$He, $^{129}$Xe, $^{131}$Xe, $^{83}$Kr and $^{21}$Ne, and mixtures thereof.

5. The method according to claim 1, wherein said hyperpolarized gas is $^{3}$He.

6. The method according to claim 5, wherein the hyperpolarized $^{3}$He is delivered to the subject in an amount of about 0.1 to about 2 liters.

7. The method according to claim 2, wherein the injected dose of said contrast agent is in the range of about 0.05 to about 5 mg iron/kg.

8. The method according to claim 3, wherein the injected dose of said contrast agent is in the range of about 0.05 to about 0.5 mmol Gd/kg.

9. A method for the assessment of pulmonary ventilation and lung perfusion through Magnetic Resonance Imaging (MRI), comprising:
   (a) positioning a human subject in an MRI apparatus;
   (b) delivering a hyperpolarized noble gas to the subject by inhalation, followed by a breath-hold period, during which a bolus of a contrast agent for MRI is injected intravenously; and
   (c) acquiring, during said breath-hold period, at least one MR image of the lungs prior to said bolus intravenous injection and at least one MR image thereafter.

10. The method according to claim 9, wherein said contrast agent comprises a compound selected from the group consisting of superparamagnetic iron oxide nanoparticles (SPIO), ultrasmall superparamagnetic iron oxide nanoparticles (USPIO), gadolinium complexes and manganese complexes.

11. The method according to claim 9, wherein said hyperpolarized noble gas is selected from the group consisting of $^{3}$He, $^{129}$Xe, $^{131}$Xe, $^{83}$Kr and $^{21}$Ne.

12. The method according to claim 10, wherein said hyperpolarized noble gas is selected from the group consisting of $^{3}$He, $^{129}$Xe, $^{131}$Xe, $^{83}$Kr and $^{21}$Ne.

13. The method according to claim 10, wherein said contrast agent comprises a suspension of SPIO or USPIO selected from the group consisting of SBPA, AMI 25, AMI 227, AMI 121, SHU 555A and NC100150.

14. The method according to claim 10, wherein said contrast agent comprises a gadolinium complex selected from the group consisting of Gd-DTPA, Gd-DOTA, Gd-HPDO3A, Gd-BOPTA, Gd-DTPA-BMA, Gadoversetamide, Gadomer-17, Gd-EOB-DTPA, Gadobutrol and MS 325.

15. The method according to any one of claims 11 to 14, wherein said hyperpolarized gas is $^{3}$He.

16. The method of claim 15, further comprising a step in which Helium gas is used to manufacture the hyperpolarized $^{3}$He gas.

* * * * *